United States Patent [19]

Mitchell et al.

[11] Patent Number: 4,702,941
[45] Date of Patent: Oct. 27, 1987

[54] GOLD METALLIZATION PROCESS

[75] Inventors: Curtis W. Mitchell, Scottsdale; Barry C. Johnson, Tempe, both of Ariz.

[73] Assignee: Motorola Inc., Schaumburg, Ill.

[21] Appl. No.: 593,949

[22] Filed: Mar. 27, 1984

[51] Int. Cl.[4] .............................................. C23C 16/06
[52] U.S. Cl. ............................... 427/250; 204/192.15; 204/192.25; 427/124; 427/125; 427/255
[58] Field of Search ................. 427/250, 91, 255, 124, 427/314, 125, 374.1, 383.3, 398.1, 398.4; 204/192 C, 192 S

[56] References Cited

U.S. PATENT DOCUMENTS

| | | | |
|---|---|---|---|
| 3,028,663 | 4/1962 | Iwersen et al. | 427/91 |
| 3,063,867 | 11/1962 | Emery | 427/250 |
| 3,158,504 | 11/1964 | Anderson | 427/91 |
| 3,393,091 | 7/1968 | Hartmann et al. | 427/91 |
| 3,440,113 | 4/1969 | Wolley | 427/91 |
| 3,729,807 | 5/1973 | Fujiwara | 427/250 |
| 3,775,157 | 11/1973 | Fromson | 427/250 |
| 3,969,545 | 7/1976 | Slocum | 427/250 |
| 4,065,588 | 12/1977 | Arnold | 427/91 |
| 4,309,460 | 1/1982 | Singh et al. | 427/250 |
| 4,408,561 | 10/1983 | Yokoyama et al. | 427/398.4 |

FOREIGN PATENT DOCUMENTS

| | | | |
|---|---|---|---|
| 55-17104 | 5/1980 | Japan | 427/250 |
| 56-103432 | 8/1981 | Japan | 427/91 |

Primary Examiner—Sadie L. Childs
Attorney, Agent, or Firm—John Fisher; Raymond J. Warren

[57] ABSTRACT

A one step metallization is disclosed for applying a layer of gold or gold alloy to the back of a silicon substrate to facilitate bonding that substrate to a metallized package member. The gold is applied to the substrate, for example by evaporation, while the substrate is maintained at a temperature between about 200° C. and about 360° C. Following the deposition the substrate is quickly cooled to room temperature. The thickness of the gold layer and the deposition temperature are adjusted to insure that the silicon diffusion profile is contained within the gold film during deposition. This insures good adhesion of the gold to the silicon substrate and provides a pure gold surface layer necessary for optimum bonding of the semiconductor substrate to a metallized package portion.

12 Claims, 6 Drawing Figures

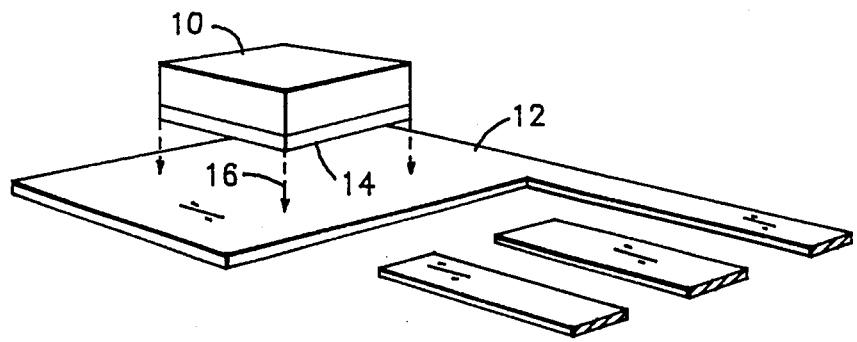
FIG. 1
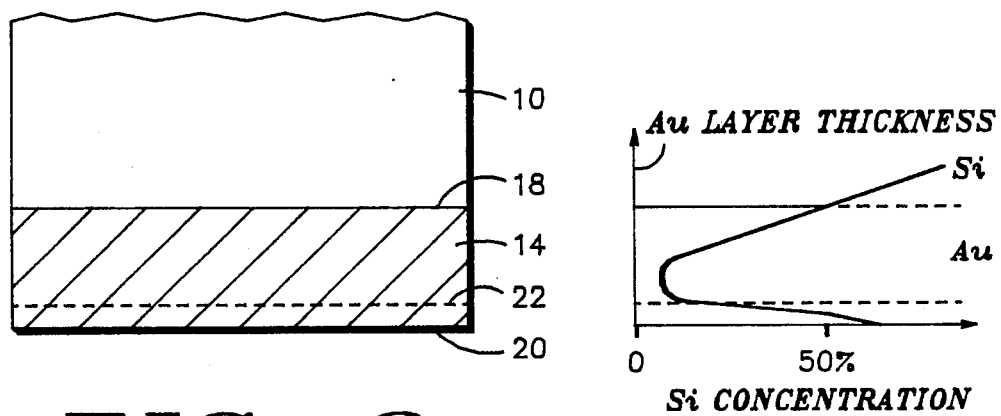
FIG. 2
FIG. 3
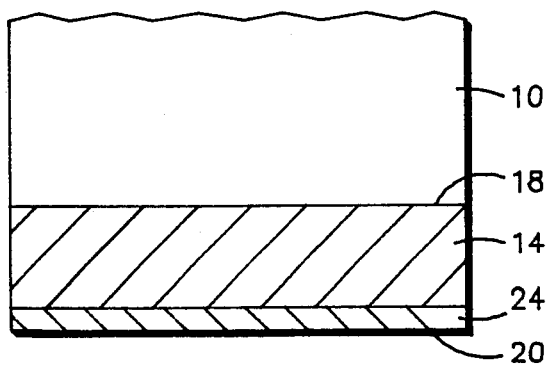
FIG. 4

GOLD METALLIZATION PROCESS

BACKGROUND OF THE INVENTION

This invention relates generally to a method for applying a layer of gold metallization to a silicon substrate, and more particularly to a one step process for applying gold or gold alloy metallization to a silicon substrate.

In the fabrication of semiconductor devices the device function is implemented in a silicon wafer through process steps of diffusion, oxidation, and the like. A large number of devices are usually fabricated on a single silicon wafer; at the completion of the processing the wafer is divided into a plurality of individual devices and each of the devices is mounted in a package for protection, heat sinking, and electrical connection. The package is metal or has a metal portion to which the device is attached. The attachment is accomplished by soldering, gluing with an adhesive epoxy, or otherwise bonding between one surface of the die and the metal or metallized package portion. In one packaging technique which is particularly efficacious for small devices and for those requiring high reliability, the die is attached using a gold/silicon eutectic bonding process. In this technique the back surface of the silicon die is coated with gold and heated to form a gold/silicon eutectic. The die is then attached to a metallized package by an additional heating step which utilizes the gold/silicon eutectic as a solder. Additional layers of gold may be added over the alloyed layer and gold or gold alloy preforms may be used as well to facilitate the bonding.

While the foregoing technique of gold/silicon eutectic bonding is a preferred method in many applications, the implementation of the method in practice is fraught with difficulties. To insure adequate bonding between the silicon and the gold, the silicon wafer with the layer of gold thereon must be raised to a temperature in excess of the gold/silicon eutectic temperature of about 373° C. At temperatures greater than 373° C. the eutectic forms rapidly and silicon diffuses through the gold layer and gold diffuses into the silicon. One problem is that the gold is usually applied to a thin wafer, i.e., a wafer of only about 150 microns in thickness. Such a thin wafer is very fragile and the heating and cooling in addition to the handling itself is likely to cause the breakage of a high percentage of wafers. Also, if the silicon diffuses completely through the gold layer so that silicon atoms are exposed at the surface of the gold, these silicon atoms can subsequently be oxidized, either by heating during a subsequent assembly step or just on exposure to room ambient. The formation of oxidized silicon at the gold surface acts as a barrier to the complete wetting of the surface during attachment to the metal package portion. This results in the formation of voids in the die bond which can severely impact the reliability of the die bond. One solution to this problem has been to apply a layer of gold to the silicon wafer, heat that layer to form the gold/silicon eutectic, and then apply a second layer of gold which is not heated. The second layer of gold protects the underlying gold/silicon eutectic from the ambient and prevents oxidation of any silicon present there. This solution, however, requires additional processing steps as well as the use of additional gold. In addition, it is often difficult to achieve good adhesion between the two gold layers because of the presence at the interface of either oxidized silicon or contaminants. A further solution which has been attempted is to form the gold silicon eutectic and then, immediately before the bonding operation is to occur, to etch the surface of the eutectic to remove a thin surface layer and to expose a fresh surface free from oxidized silicon and having a lower silicon content. This solution also involves additional handling of fragile wafers, and is ineffective if the die from the wafer are not to be immediately assembled, because the exposed silicon in the fresh surface layer can oxidize during any lengthy delay.

In view of the difficulties encountered with the prior art processes involving multiple steps of evaporation or evaporation/heat or evaporation/heat/etch, a need existed for an improved one step metallization process. It is therefore an object of this invention to provide an improved process for applying gold metallization layers to the back of silicon wafers.

It is a further object of this invention to provide an improved process for the assembly of semiconductor devices.

BRIEF SUMMARY OF THE INVENTION

The foregoing and other objects and advantages are achieved through a one step metallization process. In the process in accordance with the invention, gold or a gold alloy is deposited on a silicon wafer which is heated to a temperature of between about 200° C. and about 360° C. The thickness of the gold layer which is deposited and the temperature during the deposition are adjusted so that silicon diffuses into a portion of the gold layer to insure a good bond between the silicon and the gold, but not entirely through the gold layer. This leaves a layer of pure gold or gold alloy at the surface which facilitates subsequent bonding to a metallized package portion.

BRIEF DESCRIPTION OF THE DRAWINGS

FIG. 1 illustrates the bonding of a silicon die to a metallized package;

FIG. 2 illustrates a portion of a silicon wafer having a layer of gold on its surface;

FIG. 3 illustrates the distribution of siicon in the gold layer applied by prior art processes;

FIG. 4 illustrates a portion of a silicon wafer metallized by a further prior art process;

DETAILED DESCRIPTION OF PREFERRED EMBODIMENTS

Figure 5:
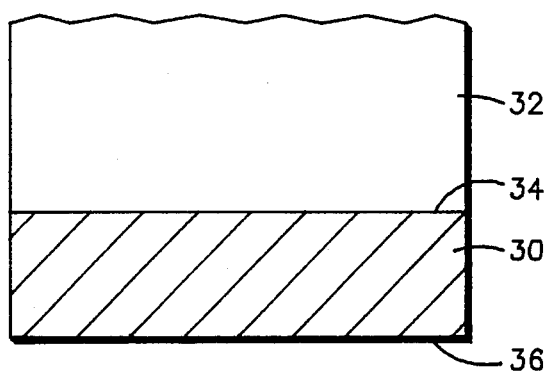
FIG. 5 illustrates a portion of a silicon wafer metallized with gold in accordance with the invention.

FIG. 1 illustrates the bonding of a silicon die 10 to a metallized package portion 12. The die can be, for example, a small signal silicon transistor and the metallized package portion can be part of what will become, for example, a TO-92 plastic encapsulated transistor package. In the die bonding process a layer of gold 14 is applied to the back surface of die 10 as disclosed more fully below. As used herein, the term "gold" is intended to include pure gold as well as gold alloyed with small amounts (typically 1-2 percent or less) of other materials such as germanium, chromium, or the like. The die is attached to the package portion 12 by placing the die in contact with the metallized package portion as indicated by arrows 16 and then heating to a temperature of about 400°–500° C. to cause flowing of layer 14. Upon cooling, the gold acts as an adhesive to solder die and package together.

FIG. 2 illustrates, in cross section, a portion of a silicon wafer having a layer of gold on the back surface thereof. In prior art processes, the structure of FIG. 2 is formed by evaporating or otherwise applying a layer of gold to substrate 10. Evaporation is either carried out at an elevated temperature in excess of the gold/silicon eutectic temperature, or evaporation is carried out at a lower temperature and then the wafer and gold are alloyed at a temperature in excess of the eutectic temperature to form a gold/silicon eutectic. The latter process is accomplished, for example, by heating the wafer with a gold layer thereon to 390° C. for about 10 minutes. Forming the gold/silicon eutectic insures a good bond between the gold and the silicon at the interface 18 between the two materials. In the absence of an alloying step, an inadequate bond is achieved which can result in the gold being peeled from the silicon substrate.

During the process of alloying the gold layer on the surface of the silicon wafer, silicon diffuses from the wafer into the gold layer in accordance with classical liquid diffusion theory. The distribution of silicon in the gold layer, as determined, for example, by Auger spectroscopy, is illustrated in FIG. 3. The silicon content is approximately 50% at the original silicon/gold interface 18, drops within the gold layer, and then typically exceeds 50% at the outer surface 20 of the gold layer. The presence of such a high concentration of silicon at the outer boundary of the gold layer is due to the rapid diffusion of silicon across the gold surface, and leads to severe problems in the die bonding process. The silicon embrittles the gold layer, and silicon exposed at the surface of the gold can oxidize, forming an impediment to bonding. One attempted solution to this problem is to etch off the surface of the gold to expose a fresh surface as indicated by the dotted line 22. Concentration of silicon at this new surface is lower, and by performing the etching immediately before a bonding operation, the bonding can be carried out before the silicon has a chance to oxidize; albeit this time interval is quite short by typical manufacturing standards.

A further solution to the above-noted problem has been to evaporate a second layer of gold 24 over the alloyed layer of gold as illustrated in FIG. 4. The second layer of gold, which is not alloyed, protects the silicon at surface 20 from oxidation. This solution, unfortunately, requires the additional use of gold, involves extra process steps, and has the possible problem of poor adhesion between layers 24 and 14 if there is any contamination or oxidation at surface 20.

The foregoing problems are overcome, in accordance with the invention, by a one step gold metallization process. In one embodiment of the invention, a silicon wafer having a clean, bare surface is placed in a vacuum evaporator. The surface is cleaned, for example, by a series of standard solvent or acid cleans and water rinses. The evaporator is pumped down to a reduced pressure, preferably about $10^{-5} - 5 \times 10^{-6}$ mm Hg or less. The silicon wafer is heated in the evaporator to a temperature between about 200° C. and about 360° C. The upper temperature is selected to be slightly less than the gold/silicon eutectic temperature of 373° C. With the silicon wafer at the elevated temperature, gold is evaporated onto the surface of the silicon wafer. Following the evaporation, the wafer temperature is rapidly lowered, preferably to about room temperature. Rapid cooling of the wafer can be effected by venting the evaporator to air or by injecting nitrogen from a liquid nitrogen source. The wafers are preferably cooled to about room temperature in about 10 minutes or less.

In a further embodiment of the invention, the gold layer can be evaporated on clean, unheated silicon surfaces. Following the evaporation, wafers are heated to a temperature of 200°–360° C. for a time to diffuse silicon into the gold, but not through the gold, and to diffuse gold into the silicon. Preferably, the silicon wafers are heated to about 300° C. for about 10 minutes.

In a still further embodiment of the invention, the gold layer is applied to the silicon wafers by sputtering. A final clean of the wafer surfaces prior to gold application can be accomplished by sputter cleaning. The gold can be applied by sputtering with the wafers held at 200°–360° C. or, alternatively, by sputtering onto unheated wafers and subsequently heat treating. Preferably the heat treating is done at about 300° C. for about 10 minutes.

Figure 6:
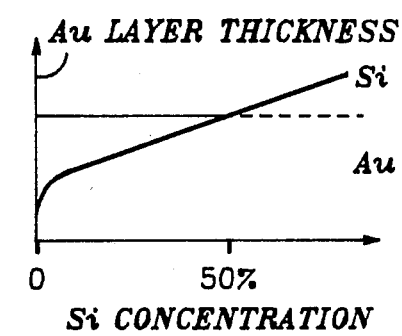
FIG. 6 illustrates the distribution of silicon in a gold layer applied in accordance with the invention.

A silicon wafer prepared with a layer of gold by the above process is illustrated in FIG. 5. A layer 30 of gold is rigidly adherent to the back of silicon wafer 36. FIG. 6 illustrates the concentration profile of silicon in the gold layer 30. At the gold/silicon interface 34 the silicon concentration is approximately 50%. The silicon concentration drops to zero at a position near, but just below, the surface of the gold layer to leave a pure, silicon free gold surface 36. The incorporation of silicon into the gold film at interface 34 insures a strong bond between gold layer 30 and silicon 32. The absence of gold at surface 36 promotes effective bonding of silicon 32 to a metallized package portion by the gold since there is no exposed silicon to oxidize or cause bond-preventing embrittlement. The thickness of the gold layer and the time and temperature of deposition, and the time the substrate and gold layer are maintained at an elevated temperature determine distribution of silicon in the gold layer. Good adhesion at the silicon/gold interface occurs when enough silicon diffuses across the interface into the gold and gold across the interface into the silicon to form a strong chemical bond. Additionally, enough silicon must diffuse into the majority of the gold layer so that the eutectic composition is met for the elevated temperature conditions subsequently encountered during a die bonding process. The optimum silicon distribution profile or gradient within the gold layer can be approximated from classical diffusion theory for solids. Optimum results are achieved, in accordance with the invention, for layers of gold between about 0.2 microns and about 2.0 microns. For the thinner layers the deposition temperature should be limited to about 200° C. For the thicker layers the deposition temperature can be increased to about 360° C. The rapid cooling of the wafer following application of the gold layer limits the continued diffusion of silicon into the gold.

A number of advantages accrue from practice of the one step gold deposition process in accordance with the invention. Costs are reduced because the thickness of the gold layer can be reduced by as much as a factor of 2 and still achieve excellent die bonding. Costs are also decreased because a number of process steps are eliminated. Elimination of the process steps also indirectly increases yields because wafer breakage associated with the wafer handling of each process step is reduced. Use of the one step process also increases die bonding process flexibility, because the presence of the pure gold layer on the exposed surface allows bonding to copper and other non-noble metals as well as to gold.

The use of the one step process also increases reliability of the resulting die bond. The kinetics of the one step gold process are easier to control because solid diffusion dominates rather than the less stable liquid diffusion of the prior art. Application of solid diffusion theory permits the tailoring of the silicon profile within the gold to provide optimum die bonding and reliability consistent with a particular die bond process. The negligible concentration of silicon at the exposed gold surface allows a reduction in the die bonding temperature from about 500° C. to about 400° C. This reduction in temperature is accompanied by reduction in die stress. By controlling and reducing the amount of silicon in the gold layer, the conductivity of the back metal is increased. In addition, because there is no silicon exposed at the surface of the gold layer, wafer storage requirements are reduced since there is no need to protect exposed silicon from oxidation.

Thus, it is apparent that there has been provided, in accordance with the invention, an improved one step gold metallization process and an improved die bonding process. While the invention has been described and illustrated with reference to specific embodiments thereof, it is not intended that the invention be limited to these illustrative embodiments. Those skilled in the art will recognize, after review of the foregoing description, that variations and modifications differing from the illustrative embodiments are possible. It is intended that all such variations and modifications as fall within the spirit and scope of the invention be included within the appended claims.

We claim:

1. A one step method for applying a layer of metal comprising gold to a silicon substrate surface which comprises the steps of: cleaning said surface; heating said substrate to a first temperature of between about 200° C. and about 360° C. in a reduced pressure ambient; evaporating said metal at a reduced pressure onto said surface at said first temperature, allowing silicon to diffuse into but not through said metal; and cooling said substrate to a second temperature lower than said first temperature to limit the continued diffusion of silicon into but not through said metal.

2. The method of claim 1 wherein said metal comprises pure gold.

3. The method of claim 1 wherein said metal comprises gold admixed with small amounts of other materials.

4. The method of claim 1 wherein said second temperature is room temperature.

5. The method of claim 1 wherein said step of cooling comprises venting said vacuum with nitrogen.

6. The method of claim 5 wherein said pure nitrogen is obtained from boiling a liquid nitrogen source.

7. The method of claim 1 wherein said step of cooling comprises venting said vacuum with air.

8. An improved method for attaching a silicon die to a metallic package substrate wherein the improvement comprises the steps of: applying a single layer of gold metallization to a surface of said die by evaporation at a reduced pressure while heating said die to a temperature of 200°–360° C.; and rapidly cooling said die to about room temperature to limit the diffusion of silicon from said silicon die into said gold, allowing silicon to diffuse into but not through said gold; and eutectic bonding said die to said substrate using said single layer of gold metallization as a solder.

9. A method for applying a layer of gold metallization to a silicon substrate which comprises the steps of: evaporating gold onto an unheated silicon substrate, said substrate maintained in a reduced pressure during said evaporating; subsequently heating said substrate to a temperature between about 200° C. and about 360° C. to diffuse silicon into but not through said gold; and rapidly cooling said substrate to limit diffusion of said silicon into but not through said gold.

10. The method of claim 9 wherein said substrate is heated to about 300° C. for about 10 minutes.

11. A method for applying a layer of gold metallization to a silicon substrate which comprises the steps of: sputtering gold onto an unheated silicon substrate; subsequently heating said substrate to a temperature between about 200° C. and about 360° C.; and cooling said substrate to limit diffusion of silicon into but not through said gold.

12. A one step method for applying a layer of metal comprising gold to a silicon substrate surface which comprises the steps of: cleaning said surface; heating said substrate to a first temperature of between about 200° C. and about 360° C. in a reduced pressure ambient; sputtering said metal onto said surface at said first temperature; and cooling said substrate to a second temperature lower than said first temperature to limit diffusion of silicon from said silicon substrate into but not through said metal.

* * * * *